US008669768B2

(12) United States Patent
Hinow et al.

(10) Patent No.: US 8,669,768 B2
(45) Date of Patent: Mar. 11, 2014

(54) HIGH-VOLTAGE PULSE TEST SYSTEM

(75) Inventors: Martin Hinow, Dresden (DE); Martin Kubat, Dresden (DE); Thomas Steiner, Radebeul (DE)

(73) Assignee: Maschinenfabrik Reinhausen GmbH, Regensburg (DE)

( * ) Notice: Subject to any disclaimer, the term of this patent is extended or adjusted under 35 U.S.C. 154(b) by 110 days.

(21) Appl. No.: 13/126,207

(22) PCT Filed: Jan. 12, 2010

(86) PCT No.: PCT/EP2010/000097
§ 371 (c)(1),
(2), (4) Date: May 9, 2011

(87) PCT Pub. No.: WO2010/099843
PCT Pub. Date: Sep. 10, 2010

(65) Prior Publication Data
US 2011/0304342 A1    Dec. 15, 2011

(30) Foreign Application Priority Data
Mar. 6, 2009    (DE) .......................... 10 2009 012 113

(51) Int. Cl.
*G01R 31/02*    (2006.01)
(52) U.S. Cl.
USPC ........................................ 324/537

(58) Field of Classification Search
USPC ................. 324/762.01–762.1, 537, 548, 557; 361/91.1, 111, 117–130
See application file for complete search history.

(56) References Cited

U.S. PATENT DOCUMENTS

| 6,111,740 A  * | 8/2000 | Danowsky et al. ........... 361/120 |
| 6,211,683 B1   | 4/2001 | Wolf |
| 2009/0021881 A1* | 1/2009 | Crevenat ....................... 361/111 |

FOREIGN PATENT DOCUMENTS

| DE | 455933 B | 2/1928 |
| DE | 143130 B | 7/1980 |

OTHER PUBLICATIONS

"Low-Damped Capacitive Impulse Voltage Dividers" Highvolt, http://www.highvolt.de/datasheets/3-61-4.pdf.
"Impulse Voltage Test System SGASA 100-800 kV, 5-40 kJ" Haefely High Voltage Test, NO E 113.12, Feb. 2001, p. 10-12 XP009101013.

* cited by examiner

*Primary Examiner* — Tung X Nguyen
(74) *Attorney, Agent, or Firm* — Andrew Wilford

(57) ABSTRACT

The present invention relates to a device for system components of a high-voltage impulse test system, preferably for quality assurance of power transformers. According to the invention, a common base frame having only one main electrode common to the system components is proposed for the spatial collection of the system components.

6 Claims, 3 Drawing Sheets

HIGH-VOLTAGE PULSE TEST SYSTEM

CROSS REFERENCE TO RELATED APPLICATIONS

This application is the US-national stage of PCT application PCT/EP2010/000097, filed 12 Jan. 2010, published 10 Sep. 2010 as WO2010/099843, and claiming the priority of German patent application 102009012113.7 itself filed 6 Mar. 2009.

FIELD OF THE INVENTION

The present invention relates to a device for system components of a high-voltage pulse test system, preferably for quality assurance of power transformers.

BACKGROUND OF THE INVENTION

The high-voltage test has the purpose of simulating transient over-voltages in three-phase current mains by means of artificially generated pulselike surges. In that case, distinction is conventionally made between external over-voltages, which are produced by, for example, a lightning strike, and internal circuit over-voltages that arise due to switching processes in the mains. The multiplicity of over-voltage phenomena are, for test purposes, reduced to standardized lightning and circuit surge voltages. For these test voltages characteristic magnitudes are established that describe the rise in the voltage, the peak value and the decay within specific tolerances. In the case of cut-off lightning strike voltage, which is to simulate the effect of very rapid voltage changes, the cut-off time is added as a further characterizing magnitude. The requirements, forms of voltage and the determination of the parameters thereof are defined in ICE 60060-1. Depending on the respective standard check carried out, the high-voltage pulse test system comprises for that purpose a pulse generator and auxiliary components such as a cut-off spark gap, a voltage divider and an overshoot compensator.

In order to generate the required pulse-shaped surge voltages Marx multiplication circuits, also termed Marx generators, in particular have become established on the market in the course of time. The circuit type developed by the inventor of the same name in 1923 and granted as a patent under the number DE 455 933 has been constructed in multiple circuit stages, wherein each of the stages comprises a surge capacitance and a switching element, particularly a switching spark gap, connected in series and a resistor connected in parallel with the surge capacitance and the switching element as well as a resistor connected in series therewith. In that case two successive stages are connected together in such a manner that they are chargeable in parallel and dischargeable in series.

The surge capacitors are charged by means of a charging direct voltage. Interpolated charge resistors in this regard not only limit the charging current, but also allow a transient serial connection of the capacitors by means of the spark gaps. The clearances of the spark gaps are so selected that these are not quite broken down when the maximum charging voltage is reached.

After all surge capacitors have been charged to their quasistatic final value of the voltage, ignition of the lowermost spark gap takes place, which thereupon breaks down. At the next spark gap twice the charging voltage is now present so that this is reliably ignited. Regardless of the number of incorporated stages, the discharging process continues on the basis of addition of the charging voltages of previously ignited stages up to the last stage.

In this manner, surge voltage pulses of very short duration and at the same time large amplitude can be generated, such pulses being particularly suitable for checking purposes and tests in high-voltage engineering and for proving insulation co-ordination and interference resistor in electromagnetic compatibility.

In addition, it is known from, for example DE 196 39 023 [U.S. Pat. No. 6,211,683] to increase the limit load capacitance of the just-described Marx generator by means of a circuit addition in that during the overshoot at the load capacitance i.e. at the test piece, a voltage reduction is achieved that after the overshoot has diminished is increased again. The circuit addition, also termed serial overshoot compensator, thus does not reduce the cause of the overshoot, but provides compensation for the overshoot at the load capacitance, i.e. in particular at the test piece. The overshoot compensator consists of a compensation capacitance and at least one discharge resistor connected in parallel therewith or a discharge spark gap, wherein the circuit addition is to be incorporated in the Marx multiplication circuits in serial mode of construction with respect to the test object. Apart from the overshoot compensator connected in series with the test object, it is also known to design this in a form connected in parallel with the test piece. In departure from the just-described form, in the case of an overshoot compensator constructed in that manner the compensation capacitance and the at least one discharge resistor or discharge spark gap are arranged in series.

Moreover, it is also necessary for simulation of an overvoltage load in accordance with operation and for proving the insulation integrity of high-voltage components to load the test objects, as already mentioned, with a cut-off surge pulse voltage. For a successful devolution of a standard check of that kind it is essential for the applied voltage to be interrupted within a tolerance of a few microseconds of the desired time elapsed since the start of the voltage wave. In technical terms this is realized by cut-off spark gaps such as have been known for a long time from the prior art, for example from DD 143 130.

Moreover, in a high-voltage pulse test system, apart from the test object a capacitively damped pulse voltage divider is also connected with the last stage of the Marx multiplication circuit and reduces the lightning pulse voltage, which is generated on discharge of the stages, to values that can be processed by the measuring and recording instruments.

All these incorporated system components of the high-voltage pulse test system have an appreciable physical size and have to be arranged in the test field at a predetermined mutual minimum spacing dependent on the voltage level. Beyond that, similarly defined voltage-dependent minimum spacings between voltage-carrying elements and the test field boundary have to be maintained. The requirement for space of the entire high-voltage pulse test system is thus substantial. Moreover, in the case of many transformer manufacturers the entire high-voltage pulse test system has to be shifted for changing the test object. In this case the Marx generator and the three further auxiliary components have to be individually moved through the test establishment and reassembled and set up again as a high-voltage pulse test system. This process is time-consuming and inconvenient in practice.

OBJECT OF THE INVENTION

The object of the present invention is to reduce the voltage-induced physical size of the auxiliary components, particularly the cut-off spark gap, the overshoot compensator and the voltage divider and thus to reduce the need for space of the entire high-voltage pulse test system so as to be able to operate the test establishment more efficiently.

Moreover, it is an object of the invention to reduce the number of conductive connections that have to be realized and thus to save the time imposed by the installation for setting up the high-voltage pulse test system.

SUMMARY OF THE INVENTION

This object is fulfilled by a device for system components of a high-voltage pulse test system in which at least two of the auxiliary components or devices are arranged a common base frame with a single head electrode for the auxiliary components.

The general idea of the invention consists of replacing the previously separate base frame and respective head electrodes of the individual auxiliary components by a common base frame with a head electrode common to the auxiliary components. Moreover, a common conductive connecting point shall serve as connecting region for all auxiliary components. Due to the fact that the connection regions of the auxiliary components are brought together at a common connecting point, they have the same voltage level in this region during the check that is carried out. Therefore, only a connection to the generator and one to the test object are still needed for operation of the high-voltage pulse check system. In addition, through the constructional combination of the auxiliary components in a common base frame it is possible for the plant operator for the first time to satisfy the demand, which has existed for some years, for high-voltage pulse test systems with a small space requirement, simple capability of transport and short installation times accompanying that. The large extent of area of the high-voltage pulse test system was previously due to the large predetermined voltage-dependent spacings between the individual head electrodes of the respective auxiliary components. In order to replace these multiple head electrodes by a single head electrode at the base frame and, in addition, to physically combine the auxiliary components in the base frame it was, however, necessary to inventively solve the following technical problems.

Additional stray capacitances negatively influencing the accuracy of the voltage divider arise through the mere physical combining of the auxiliary components. In that case the voltage divider has to be adapted so that the measurements that are carried out are characterized by a high level of accuracy notwithstanding the large stray capacitances that arise. According to the invention this is achieved on the one hand by a defined physical arrangement of the auxiliary components so that the parasitic capacitive effect is small and on the other hand by a defined determination of the capacitances within the auxiliary components that are used, so that the resulting overall capacitance allows accurate measurement, and in addition through suitable selection of the divider capacitance and the divider resistor. However, due to the absence of linear correlations of the just-mentioned setting possibilities only approximation models are to be found in the literature for determination of these parameters, which has the consequence that the magnitudes of the parasitic capacitances have to be estimated by simulations. These simulations have to be subsequently verified in development tests; the whole is thus an iterative process.

Moreover, through the physical combination of the auxiliary components the electromagnetic fields that arise are to be dispersed so as to effectively prevent voltage arcs that occur. Specifically, the arc-through of the cut-off spark gap is connected with a complicated transient process. In that case, the cut-off spark gap carries for a short time a zero potential whilst the remaining auxiliary components, due to their intrinsic capacitances, are still acted on by high voltages. The field control therefore has to be optimized in such a manner as to prevent a voltage arc between the voltage divider and the cut-off spark gap or the overshoot compensator and the cut-off spark gap, for which purpose a comprehensive field calculation is required. Since, however, in most field calculation programs only the static fields, but not the transient case of substantially changing fields, can be calculated an iterative process between simulation and constructional realization is also regarded as necessary for this purpose. In this connection it has proved advantageous to mutually electrically screen the overshoot compensator and the voltage divider by additional toroids.

Although it has become known from the first time from the company document 3.62/4 of the applicant to integrate a cut-off spark gap with a voltage divider for lightning strike switching pulses, in this device only the two auxiliary components can be used, unlike the present invention, at the same time. Cut-off spark gaps known from prior art usually comprise, inter alia, a column consisting of a combination of resistors and capacitances and thus have the same components as capacitively damped voltage dividers. If the spark gap is not arced through it is thereby possible to change the function of the column of the cut-off spark gap into that of a voltage divider. However, this also means in the converse that an additional voltage divider has to be present for the test if the voltage source is cut off, thus the spark gap arced through. A solution for physical bringing together of the auxiliary components cannot be inferred from this company document.

Moreover, it is also entirely conceivable within the scope of the invention to physically bring together only two of the possible three auxiliary components in the common base frame, since, for example, the use of the overshoot compensator is not regarded as absolutely functionally necessary, but only increases the quality of the lightning strike voltage that is produced. In addition, a different possibility of combination of the auxiliary components is conceivable.

BRIEF DESCRIPTION OF THE DRAWING

The device shall be explained in the following by way of example on the basis of drawings, in which.

DETAILED DESCRIPTION OF THE INVENTION

Figure 1:
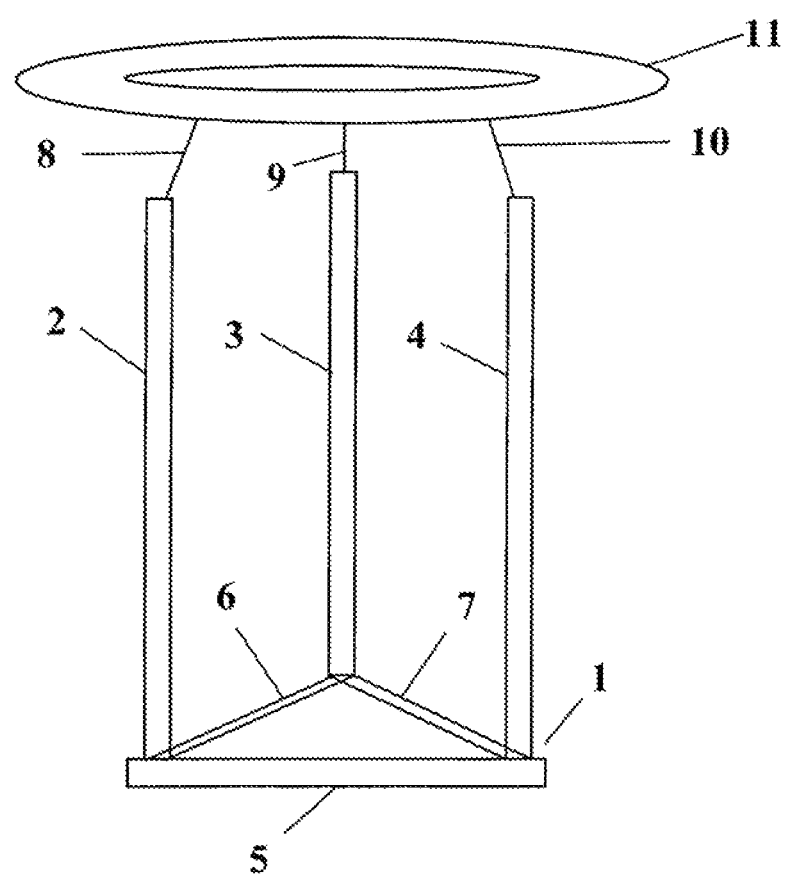
FIG. 1 shows a schematic illustration of a device according to the invention for system components of a high-voltage pulse test system and FIGS. 2a and 2b show a preferred form of embodiment of a device according to the invention for system components of a high-voltage pulse test system.

A base frame 1 according to the invention for mounting auxiliary components or devices, such as a cut-off spark gap 2, a voltage divider 3 or an overshoot compensator 4, is illustrated in FIG. 1. The auxiliary components or devices are, for reasons of clarity, illustrated in FIG. 1 only schematically. In that case the base frame 1 comprises, for a secure stance, a base region of interconnected steel tubes 5, 6 and 7 that is, for example, triangular. The cut-off spark gap 2, the voltage divider 3 and the overshoot compensator 4 are arranged at the respective corner points of the base frame 1 and conductively connected therewith. In addition, the upper ends of the corresponding auxiliary components are mechanically fixed by electrically conductive transverse struts 8, 9 and 10. Moreover, a head electrode 11, which can, for example, be constructed as a toroid, is connected with the transverse struts 8, 9 and 10. The conductive transverse struts 8, 9 and 10 thus fulfil not only the task of mechanically holding the head electrode 11, but also that of creating an equalization of potential between the auxiliary components and the head electrode 11. The head electrode 11 in the illustrated exemplifying embodiment is dimensioned in such a manner that the outer circumference projects beyond the auxiliary components arranged at the respective corner points. This dimensioning can, however, vary depending on use, the spacing from the laboratory wall or laboratory ceiling or the voltage level and is therefore to be regarded only as an example. It is entirely conceivable within the scope of the invention to fasten only two of the possible three auxiliary components to the respective corner points of the triangular base region or, on the other hand, to structurally modify the base frame 1 according to the invention with only two mounts for the auxiliary components. In addition, the auxiliary components are conductively interconnected by way of a common connection point in the region of the conductive transverse struts 8, 9 and 10 and thus have the same voltage in this region.

Figure 2A:
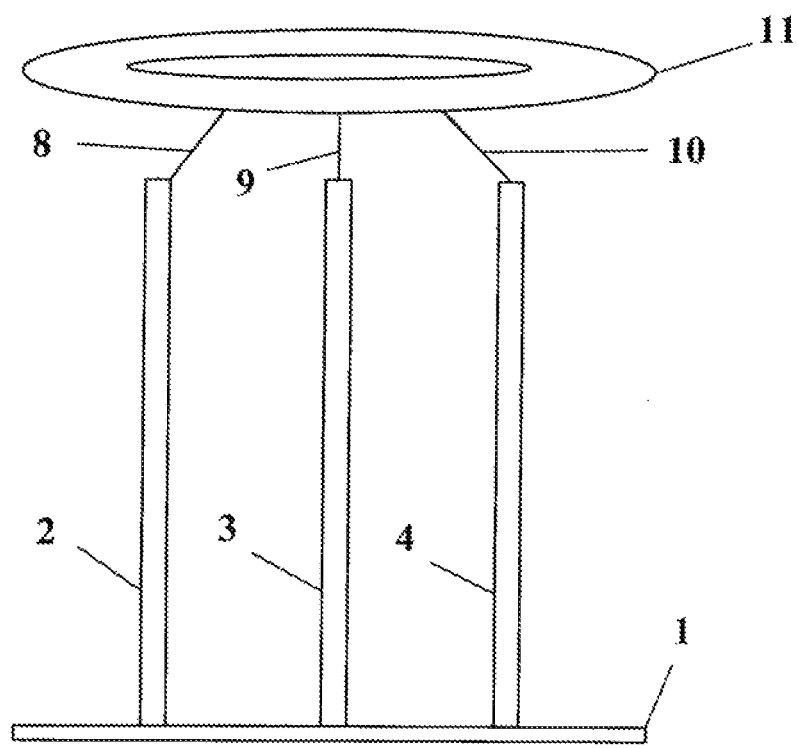
Figure 2B:
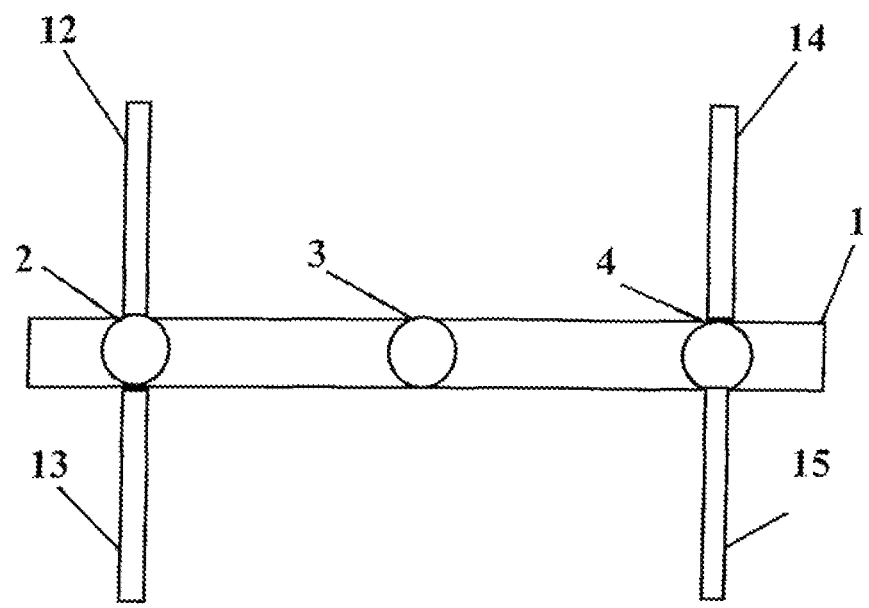

FIGS. 2a and 2b show a preferred form of embodiment of the invention in which the base region of the base frame 1 is, in departure from FIG. 1, not triangular, but constructed to be elongated, thus linear. In addition, arms 12, 13, 14 and 15 laterally fastened to the base frame 1 ensure a secure stance of the modified frame construction. It is also applicable to this form of embodiment that it can equally well be constructed with mounts for only two auxiliary components.

Thus, all base frame embodiments of the general inventive idea of this application are to be arranged so as to make it possible to replace the previous separate base frame and respective head electrodes of the individual auxiliary components by a common base frame with a head electrode common to the auxiliary components.

The invention claimed is:

1. A high-voltage pulse test system comprising:
   a cut-off spark-gap device having an upper end and a lower end;
   a voltage-dividing device having an upper end and a lower end;
   an overshoot-compensating device having an upper end and a lower end;
   a common triangular base frame having corners at each of which a respective one of the lower ends is mounted;
   to a single head electrode for all of the devices; and
   respective electrically conductive transverse struts each connected between the head electrode and a respective one of the upper ends for equalizing potential between the devices and the head electrode.

2. The test system defined in claim 1, wherein the base frame is formed of steel tubes.

3. The test system defined in claim 1, wherein the head electrode is toroidal.

4. A high-voltage pulse test system comprising:
   a cut-off spark-gap device;
   a voltage-dividing device;
   an overshoot-compensating device;
   a linear common base frame on which at least two of the lower ends are mounted;
   arms projecting laterally from and stabilizing the base frame;
   a single head electrode for all of the devices; and
   respective electrically conductive transverse struts each connected between the head electrode and a respective one of the upper ends of the two devices for equalizing potential between the two devices and the head electrode.

5. A high-voltage pulse test system comprising:
   a cut-off spark-gap device;
   a voltage-dividing device;
   an overshoot-compensating device;
   a common base frame on which at least two of the devices are mounted;
   a single head electrode for all of the devices; and
   respective electrically conductive transverse struts each connected between the head electrode and a respective one of the upper ends of the two devices for equalizing potential between the two devices and the head electrode.

6. A high-voltage pulse test system comprising:
   a cut-off spark-gap device
   a voltage-dividing device;
   an overshoot-compensating device;
   a common base frame carrying at least two of the devices; and
   a single head electrode for all of the devices;
   respective electrically conductive transverse struts each connected between the head electrode and a respective one of the upper ends of the two devices for equalizing potential between the two devices and the head electrode; and
   a common connecting point at the transverse struts forming an electrical connection interface for all the devices.

* * * * *